United States Patent
Wang et al.

(10) Patent No.: US 11,349,106 B2
(45) Date of Patent: May 31, 2022

(54) MANUFACTURE METHOD OF ELECTRONIC DEVICE, ELECTRONIC DEVICE, AND MANUFACTURE TOOL FOR ELECTRONIC DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yangpeng Wang, Beijing (CN); Fuzheng Xie, Beijing (CN); Yao Hu, Beijing (CN); Zhenhua Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 348 days.

(21) Appl. No.: 16/497,897

(22) PCT Filed: Jan. 22, 2019

(86) PCT No.: PCT/CN2019/072715
§ 371 (c)(1),
(2) Date: Sep. 26, 2019

(87) PCT Pub. No.: WO2019/237741
PCT Pub. Date: Dec. 19, 2019

(65) Prior Publication Data
US 2021/0359283 A1    Nov. 18, 2021

(30) Foreign Application Priority Data

Jun. 15, 2018 (CN) .......................... 201810621420.X

(51) Int. Cl.
*H01L 51/56* (2006.01)
*H01L 27/32* (2006.01)
(Continued)

(52) U.S. Cl.
CPC .......... *H01L 51/56* (2013.01); *H01L 27/3276* (2013.01); *H01L 51/0097* (2013.01);
(Continued)

(58) Field of Classification Search
None
See application file for complete search history.

(56) References Cited

U.S. PATENT DOCUMENTS 6,771,010 B2    8/2004  Wang
2020/0203608 A1*  6/2020  Jang ................... H01L 27/1218

FOREIGN PATENT DOCUMENTS

CN      104766820 A    7/2015
CN      106206384 A    12/2016
(Continued)

OTHER PUBLICATIONS

Machine translation of TW M552596 (Year: 2017).*

*Primary Examiner* — J. E. Schoenholtz
(74) *Attorney, Agent, or Firm* — Dilworth & Barrese, LLP.; Michael J. Musella, Esq.

(57) ABSTRACT

A manufacture method of an electronic device, an electronic device, and a manufacture tool for an electronic device are provided. The electronic device includes a stretching region and non-stretching regions on both sides of the stretching region, and the method includes: providing a flexible substrate, the flexible substrate including a stretching portion and non-stretching portions on both sides of the stretching portion, in which the stretching portion and the non-stretching portions respectively correspond to the stretching region and the non-stretching regions; stretching the stretching (Continued)

portion in a direction perpendicular to a longitudinal direction of the stretching portion, and then fixing the stretching portion to allow the stretching portion to be maintained in a stretching state; forming circuit structures on the non-stretching portions; and releasing the fixing of the stretching portion to allow the stretching portion to be restored.

19 Claims, 8 Drawing Sheets

(51) Int. Cl.
  *H01L 51/00* (2006.01)
  *H01L 51/52* (2006.01)
(52) U.S. Cl.
  CPC .... *H01L 51/5253* (2013.01); *H01L 2227/323* (2013.01); *H01L 2227/326* (2013.01); *H01L 2251/5338* (2013.01)

(56) References Cited

FOREIGN PATENT DOCUMENTS

| | | | |
|---|---|---|---|
| CN | 107564415 A | 1/2018 | |
| CN | 108898953 A | 11/2018 | |
| CN | 208271903 U | 12/2018 | |
| TW | M552596 | * 12/2017 | ............. G01N 21/84 |

* cited by examiner

MANUFACTURE METHOD OF ELECTRONIC DEVICE, ELECTRONIC DEVICE, AND MANUFACTURE TOOL FOR ELECTRONIC DEVICE

CROSS REFERENCE TO RELATED APPLICATIONS

The present application claims priority of Chinese patent application No. 201810621420.X, filed on Jun. 15, 2018, the disclosure of which is incorporated herein by reference as part of the application.

TECHNICAL FIELD

Embodiments of the present disclosure relate to a manufacture method of an electronic device, an electronic device, and a manufacture tool for an electronic device.

BACKGROUND

At present, display devices are developed to have large screens. However, portable electronic devices with large-screen display devices occupy a large space and are thus unfavorable to be carried. Therefore, adopting of a bendable or foldable display device facilitates miniaturization of portable electronic devices. Foldable display devices have attracted more and more attention because of the advantages of large screen, easy portability, and so on. Foldable display devices can be used, for example, for a variety of electronic devices such as mobile communication terminals, tablet computers, electronic books, navigation devices, and so on.

SUMMARY

At least one embodiment of the present disclosure provides a manufacture method of an electronic device, the electronic device including a stretching region and non-stretching regions on both sides of the stretching region, the method comprises: providing a flexible substrate, in which the flexible substrate comprises a stretching portion and non-stretching portions on both sides of the stretching portion, in which the stretching portion and the non-stretching portions respectively correspond to the stretching region and the non-stretching regions; stretching the stretching portion in a direction perpendicular to a longitudinal direction of the stretching portion, and then fixing the stretching portion and allowing the stretching portion to be maintained in a stretching state; forming circuit structures on the non-stretching portions; and releasing the fixing of the stretching portion to allow the stretching portion to be restored.

For example, in the manufacture method of the electronic device provided by at least one embodiment of the present disclosure, stretching of the stretching portion comprises: fixing the non-stretching portions along boundaries between the stretching portion and the non-stretching portions, and stretching the stretching portion via positions where the boundaries are located.

For example, in the manufacture method of the electronic device provided by at least one embodiment of the present disclosure, after the stretching portion is stretched, the flexible substrate is fixed to a rigid substrate, so as to allow the stretching portion to be maintained in the stretching state.

For example, in the manufacture method of the electronic device provided by at least one embodiment of the present disclosure, after the circuit structures are formed, the flexible substrate is separated from the rigid substrate, so as to release the fixing of the stretching portion.

For example, in the manufacture method of the electronic device provided by at least one embodiment of the present disclosure, a sacrificial layer is formed on the rigid substrate to fix the flexible substrate to the rigid substrate by adhering, and the sacrificial layer is removed when separating the flexible substrate from the rigid substrate.

For example, in the manufacture method of the electronic device provided by at least one embodiment of the present disclosure, the circuit structures on the non-stretching portions on both sides of the stretching portion are simultaneously formed.

For example, in the manufacture method of the electronic device provided by at least one embodiment of the present disclosure, in a process of simultaneously forming the circuit structures, the flexible substrate is covered by a mask including a shielding portion; and the shielding portion corresponds to the stretching portion to block the stretching portion.

For example, in the manufacture method of the electronic device provided by at least one embodiment of the present disclosure, a structural layer including the circuit structures are formed on the flexible substrate, and then a portion of the structural layer in the stretching region is removed, so as to allow the stretching portion to be exposed.

For example, the manufacture method of the electronic device provided by at least one embodiment of the present disclosure further comprises: forming a wire on the stretching portion to connect the circuit structures on both sides of the stretching portion.

For example, in the manufacture method of the electronic device provided by at least one embodiment of the present disclosure, after the circuit structures are formed, the method further comprises: in the stretching region, forming first encapsulation layers on side edges of the circuit structures.

For example, in the manufacture method of the electronic device provided by at least one embodiment of the present disclosure, after the stretching portion is restored, the method further comprises: forming a flexible cover plate on a side of the circuit structures away from the flexible substrate, so as to cover the circuit structures.

For example, in the manufacture method of the electronic device provided by at least one embodiment of the present disclosure, before the stretching portion is stretched, the method further comprises: performing a modification treatment on the stretching portion, so as to allow a tensile property of the stretching portion to be better than a tensile property of the non-stretching portions.

At least one embodiment of the present disclosure provides an electronic device including a stretching region and non-stretching regions on both sides of the stretching region, the electronic device comprises: a flexible substrate including a stretching portion and non-stretching portions on both sides of the stretching portion, in which the stretching portion and the non-stretching portions respectively correspond to the stretching region and the non-stretching regions; and circuit structures on the non-stretching portions. The stretching portion is stretched in a manufacture process of the electronic device, and the electronic device is bendable through the stretching region.

For example, the electronic device provided by at least one embodiment of the present disclosure further comprises: a flexible cover plate on a side of the circuit structures away from the flexible substrate to cover the circuit structures.

For example, the electronic device provided by at least one embodiment of the present disclosure further comprises:

at least two groups of driving circuits respectively in the non-stretching regions on both sides of the stretching region, so as to respectively provide driving signals for the circuit structures in the non-stretching regions.

For example, the electronic device provided by at least one embodiment of the present disclosure further comprises: a wire in the stretching region. The wire is configured to connect the circuit structures on both sides of the stretching portion.

For example, the electronic device provided by at least one embodiment of the present disclosure further comprises: first encapsulation layers on side edges of the circuit structures closer to the stretching portion.

At least one embodiment of the present disclosure provides a manufacture tool for an electronic device, which comprises a bearing platform for supporting a flexible substrate; and at least one fixing portion for detachably fixing the flexible substrate to the bearing platform. The bearing platform comprises at least two portions, a gap between adjacent two portions is adjustable, and the at least one fixing portion is respectively at edge positions of the two portions closer to the gap, so as to allow the flexible substrate that is fixed to be stretched only at a position corresponding to the gap.

For example, the manufacture tool for an electronic device provided by at least one embodiment of the present disclosure further comprises a driving device. The driving device is connected to and configured to drive the bearing platform, so as to adjust a size of the gap between the adjacent two portions of the bearing platform, so as to stretch or restore the flexible substrate that is fixed.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
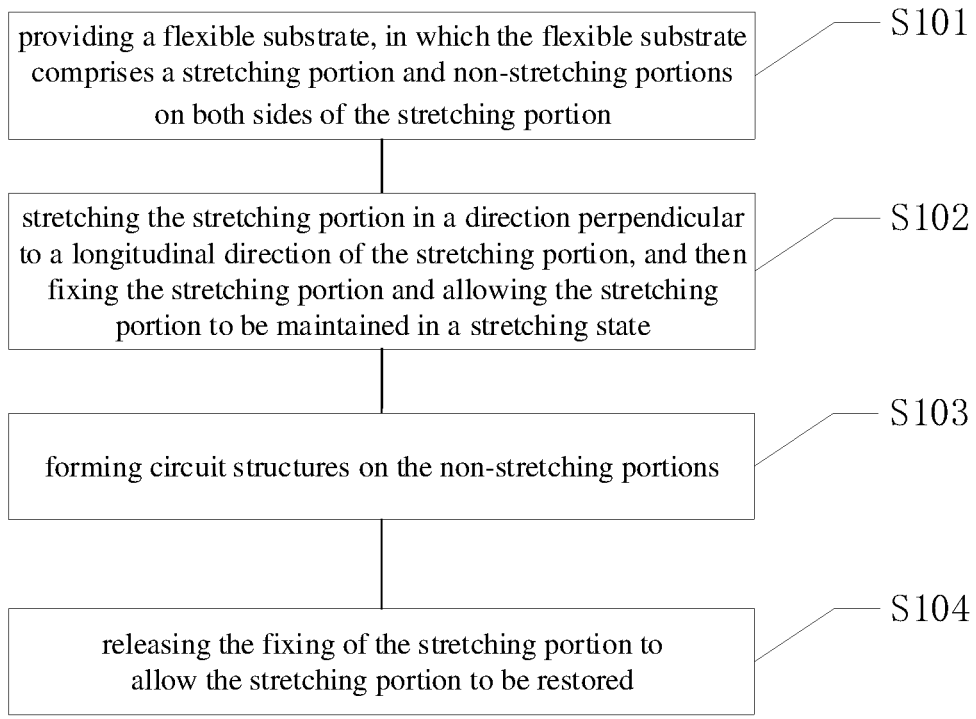
FIG. 1 is a flow diagram of a manufacture method of an electronic device provided by some embodiments of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "comprise/comprising," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but can comprise an electrical connection/coupling, directly or indirectly. The terms, "on," "under," "left," "right," or the like are only used to indicate relative position relationship, and when the position of the object which is described is changed, the relative position relationship can be changed accordingly.

At present, A foldable display screen is generally obtained by conjoining two or more display screens together. Although this manufacture method is simple, the gaps between a plurality of display screens of the foldable display screen are generally large. In the case where the plurality of display screens cooperate to display an image, there is a large dead region (for example, the dead region is the region that cannot provide display information) caused by the gaps between the plurality of display screens, which has a relatively large effects on the overall display effect of the foldable display screen. In addition, the foldable display screen may also adopt a flexible display screen, so as to realize the foldable function by the flexibility of the flexible screen. In the case, each functional layer of the flexible display screen needs to have a predetermined flexibility, thereby narrowing the material selection range of each functional layer, and limiting the further improvement of the performance of the flexible display screen. In addition, the stresses sustained by the functional layers during folding can be different, and therefore, it is necessary to simulate and precisely design the stresses sustained by the functional layers, otherwise, the functional layers can be prone to breakage or be stripped off during folding, which affects the reliability of the final product.

At least one embodiment of the present disclosure provides a manufacture method of an electronic device, the electronic device comprises a stretching region and non-stretching regions on both sides of the stretching region, and the method comprises: providing a flexible substrate, the flexible substrate including a stretching portion and non-stretching portions on both sides of the stretching portion, in which the stretching portion and the non-stretching portions respectively correspond to the stretching region and the non-stretching regions; stretching the stretching portion in a direction perpendicular to a longitudinal direction of the stretching portion, and then fixing the stretching portion to allow the stretching portion to be maintained in a stretching state; forming circuit structures on the non-stretching portions; and releasing the fixing of the stretching portion to allow the stretching portion to be restored.

At least one embodiment of the present disclosure provides an electronic device, the electronic device comprises a stretching region and non-stretching regions on both sides of the stretching region, and comprises: a flexible substrate including a stretching portion and non-stretching portions on both sides of the stretching portion and circuit structures on the non-stretching portions. The stretching portion and the non-stretching portions respectively corresponding to the stretching region and the non-stretching regions. The stretching portion is stretched in a manufacture process of the electronic device, and the electronic device is bendable through the stretching region.

At least one embodiment of the present disclosure provides a manufacture tool for an electronic device, which comprises: a bearing platform for supporting a flexible substrate; and at least one fixing portion for detachably fixing the flexible substrate to the bearing platform. The bearing platform comprises at least two portions, a gap between adjacent two portions is adjustable, and the at least one fixing portion is respectively disposed at edge positions of the two portions closer to the gap, so as to allow the flexible substrate that is fixed to be stretched only at a position corresponding to the gap.

In the following, the manufacture method of the electronic device, the electronic device and the manufacture tool thereof, which are provided by the present disclosure will be described with reference to some specific embodiments.

Figure 16:
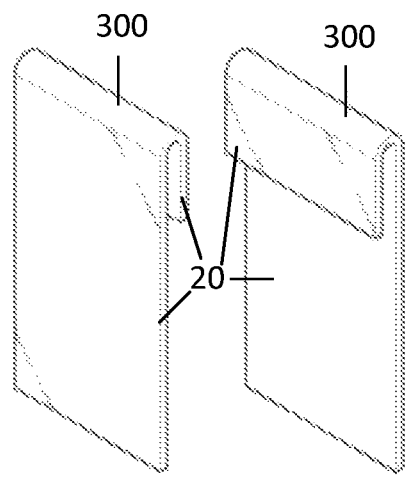
FIG. 16 is an electronic device in a bending state.

An embodiment of the present disclosure provides a manufacture method of an electronic device, the electronic device comprises a flexible substrate and various circuit structures formed on the flexible substrate, and comprises a plurality of portions that are foldable relative to each other, a bendable region is formed between two adjacent portions (for example, every two adjacent portions) of the plurality of portions. For example, the electronic device may comprise a stretching region and non-stretching regions on both sides of the stretching region, and the stretching region is the bendable region. For example, the bendable region allows the non-stretching regions on both sides of the bendable region to at least partially overlap with each other. For example, as illustrated in FIG. 16, the bendable region 300 allows two adjacent non-stretching regions 20 to overlap with each other (for example, parallel to each other).

As illustrated in FIG. 1, the manufacture method of the electronic device comprises steps S101-step S104.

Step S101: providing a flexible substrate, the flexible substrate comprises a stretching portion and non-stretching portions on both sides of the stretching portion.

Figure 2A:
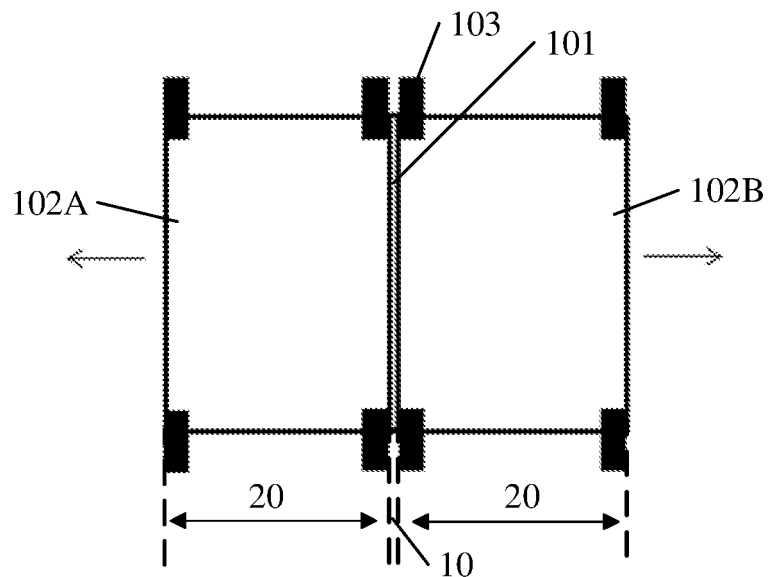
FIG. 2A and FIG. 2B are plane diagrams of a flexible substrate, before being stretched, provided by some embodiments of the present disclosure.

For example, as illustrated in FIG. 2A, the flexible substrate comprises a stretching portion 101 and non-stretching portions on both sides of the stretching portion 101, the non-stretching portions comprise, for example, a first non-stretching portion 102A and a second non-stretching portion 102B as illustrated in FIG. 2A. The stretching portion 101 corresponds to the stretching region 10 (that is, the bendable region) of the manufactured electronic device, and the non-stretching portions 102A and 102B respectively correspond to non-stretching regions 20 of the electronic device. A material for forming the flexible substrate may comprise, for example, a flexible material such as polyimide (PI), polydimethylsiloxane (PMDS), polyurethane (PU), or the like, which is not specifically limited in the embodiments of the present disclosure. For example, because the stretching portion 101 is stretched, and the stretching portion 101 has an elasticity restoring force, and in the case where the stretching portion 101 is not subjected to an external force, the elasticity restoring force allows the size of the stretching portion 101 in the direction in which the first non-stretching portion 102A and the second non-stretching portion 102B are arranged in parallel to be reduced.

Step S102: stretching the stretching portion in the direction perpendicular to the longitudinal direction (length direction) of the stretching portion, and then fixing the stretching portion and allowing the stretching portion to be maintained in a stretching state.

For example, in FIG. 2A, a vertical direction is the longitudinal direction of the stretching portion 101, and therefore, the stretching portion 101 is stretched in the horizontal direction (that is, the direction indicated by the arrow in the figure), and then the stretching portion 101 is fixed to allow the stretching portion to be maintained in a stretching state.

For example, in the case where the stretching portion 101 is stretched, the non-stretching portions 102A and 102B are fixed along boundaries between the stretching portion 101 and the non-stretching portions 102A and 102B, and the stretching portion 101 is stretched at positions where the boundaries are located, and therefore only the stretching portion 101 is stretched, and the non-stretched portions 102A and 102B are not affected.

For example, as illustrated in FIG. 2A, four corners at the boundaries between the stretching portion 101 and the non-stretching portions 102A and 102B may be respectively fixed (for example, fixed by jigs 103, and the sizes of the jigs 103 are smaller than the length of the stretching portion 101) to a bearing platform (not shown in the figure), thereby achieving the fixing of the non-stretching portions 102A and 102B (for example, achieving the fixing of the non-stretching portions 102A and 102B to the bearing platform). Then, the stretching portion 101 is stretched. For example, in the process of stretching the stretching portion 101, stretching forces can be applied to the four corners at the boundaries between the stretching portion 101 and the non-stretching portions 102A and 102B, thereby allowing the stretching forces (for example, the stretching forces are along the direction as illustrated by the arrows in FIG. 2A) to be applied only to the stretching portion 101, and not applied to the non-stretching portions 102A and 102B.

For example, in the process of stretching the stretching portion 101, the fixing of the four corners at the boundaries between the stretching portion 101 and the non-stretching portions 102A and 102B by the jigs may be temporarily released. For another example, the stretching portion 101 may be stretched first, and after the stretching portion 101 is stretched to a suitable degree, the stretching portion 101 is fixed by jigs. For further another example, the four corners at the boundaries between the stretching portion 101 and the non-stretching portions 102A and 102B may be fixed by jigs before stretching, and stretching forces are applied to the jigs during stretching process, and therefore the stretching portion 101 can be stretched through the jigs.

Figure 2B:
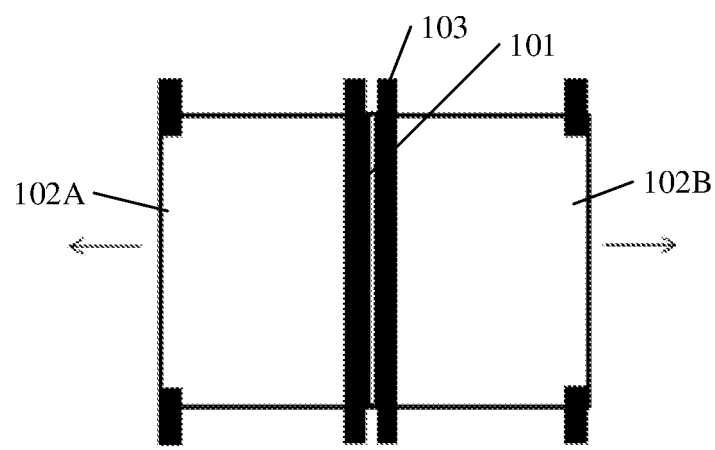

For another example, as illustrated in FIG. 2B, the entire boundaries between the stretching portion 101 and the non-stretching portions 102A and 102B may be fixed (for example, fixed by jigs 103, and the sizes of the jigs 103 are larger than the length of the stretching portion 101) to a bearing platform (not shown in the figure), in this case, the fixing of the non-stretching portions 102A and 102B (for example, the fixing of the non-stretching portions 102A and 102B to the bearing platform) can also be achieved, and then the stretching portion 101 is stretched. For example, in this case, the stretching forces applied to the stretching portion 101 can be more uniform. For example, for the example as illustrated in FIG. 2B, the specific stretching method may be referred to the example as illustrated in FIG. 2A, and details are not described here again.

Figure 3:
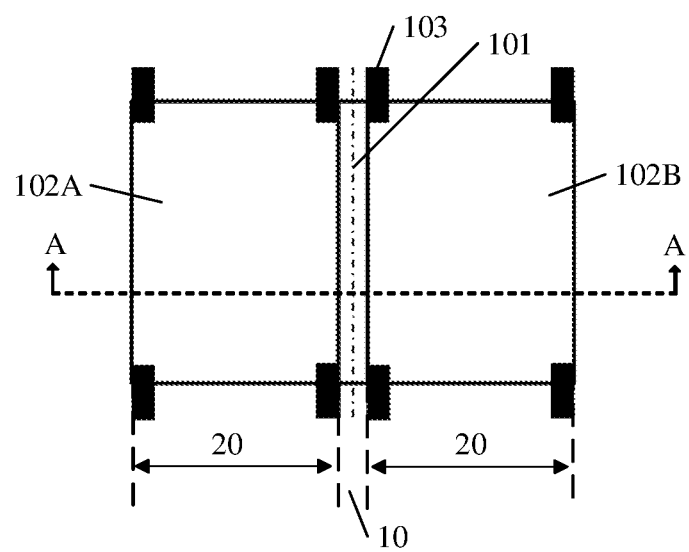
FIG. 3 is a plane diagram of a flexible substrate, after being stretched, provided by some embodiments of the present disclosure.
Figure 4:
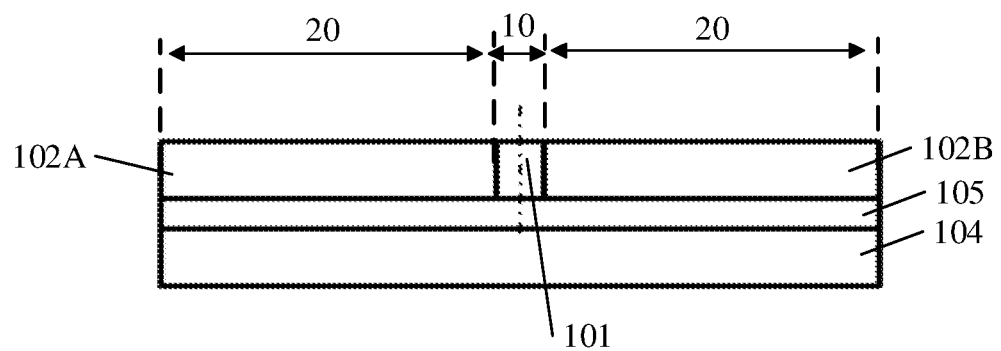
FIG. 4 is a sectional diagram of a flexible substrate, in a stretching state, provided by some embodiments of the present disclosure.

For example, in embodiments of the present disclosure, before the stretching portion 101 is stretched (for example, after the stretching portion is formed and before the stretching process is performed; or in the process of forming the stretching portion), a modification treatment may be performed on the stretching portion, so as to allow a tensile property of the stretching portion 101 to be better than a tensile property of the non-stretching portions 102A and 102B, so that the stretching portion 101 is easier to be stretched and the length of the stretching portion 101 being in a stretching state is longer. For example, the stretching portion 101 of the flexible substrate may be modified by a chemical modification method by adopting a modifier having a predetermined composition according to the material of the flexible substrate, so as to improve the tensile property of the stretching portion 101. For example, the stretching portion 101 of the flexible substrate may also be modified by a physical modification method by adopting plasma with a predetermined composition according to the material of the flexible substrate, alternatively, the stretching portion 101 of the flexible substrate is modified by ion injecting by adopting ion sources with a predetermined composition according to the material of the stretching portion of the flexible substrate 101, so as to improve the tensile property of the stretching portion 101. The treatment facilitates the stretching process to be performed only on the stretching portion 101 during the subsequent stretching process. For example, in the case where the stretching portion 101 is formed of polyimide, at least one of the following methods can be adopted to improve the tensile property of the stretching portion 101: (1) A high temperature (for example, 250-350 degrees) heat treatment (for example, treatment for 1 hour) is performed on the stretching portion 101 after the formation of the stretching portion 101 is completed. (2) An organic phosphate (for example, triphenyl phosphate) is added to the material for forming the polyimide before or during the formation of the polyimide. (3) In the process of forming the polyimide, allowing the material for forming the polyimide to be gelatinized, so as to form a gel film, and performing a stretching treatment to the above gel film. For example, as illustrated in FIG. 3 and FIG. 4 (FIG. 4 is a sectional diagram along line A-A of FIG. 3), after the stretching portion 101 is stretched, the flexible substrate is fixed, for example, fixed by adhering, to a rigid substrate 104, so as to allow the stretching portion 101 to be maintained in a stretching state. For example, a sacrificial layer 105 may be formed on the rigid substrate 104 to fix the flexible substrate to the rigid substrate 104 by adhering, and the jigs 103 can be removed after the flexible substrate is fixed to the rigid substrate 104. The sacrificial layer 105 may be removed, for example, when separating the flexible substrate from the rigid substrate 104 in a subsequent process. The material of the sacrificial layer 105 may be, for example, an adhesive material such as optical clear adhesive or the like, and the rigid substrate may be a glass substrate, a ceramic substrate, a stainless steel substrate, or the like, which is not limited by the embodiments of the present disclosure. For example, after the flexible substrate is fixed to the rigid substrate 104, the rigid substrate 104 may continuously apply stretching forces (the stretching forces may be applied by the rigid substrate 104 via the sacrificial layer 105) to the stretching portion 101 (for example, the direction of the stretching forces may be the direction as illustrated by the arrows in FIG. 2A), so as to balance the elasticity restoring force of the stretching portion 101, thereby allowing the stretching portion 101 to be maintained in the stretching state.

Step S103: forming circuit structures on the non-stretching portions.

For example, the circuit structures are simultaneously formed on the non-stretching portions 102A and 102B on both sides of the stretching portion 101, or the circuit structure on the non-stretching portion 102A and the circuit structure on the non-stretching portion 102B are formed in separate processes.

For example, in a process of forming the circuit structures in separate processes, a circuit structure may be formed on the first non-stretching portion 102A first, and then a circuit structure can be formed on the second non-stretching portion 102B; alternatively, a circuit structure can be formed on the second non-stretching portion 102B first, and then a circuit structure can be formed on the first non-stretching portion 102A.

For example, in a process of simultaneously forming the circuit structures, a mask including a shielding portion may be used to cover the flexible substrate, and the shielding portion corresponds to the stretching portion, and therefore the simultaneously forming of the circuit structures on the non-stretching portions 102A and 102B on both sides of the stretching portion 101 is achieved. Alternatively, a structural layer including the circuit structures may be directly formed on the flexible substrate, and then a portion of the structural layer in the stretching region (that is, a portion of the structural layer formed on the stretching portion) is removed, so as to allow the stretching portion 101 to be exposed, and therefore forming of the circuit structures on the non-stretching portions 102A and 102B on both sides of the stretching portion 101 in separate processes is achieved.

In embodiments of the present disclosure, the circuit structures may comprise, for example, circuit structures for realizing display function, for example, comprise functional components such as thin film transistors (including switching transistors, driving transistors, etc.), light emitting structures, storage capacitors, and so on. The manufacture method provided by embodiments of the present disclosure will be specifically described below by taking the manufacture of the circuit structures for realizing display function as an example.

For example, the circuit structures on the non-stretching portion 102A may correspond to a plurality of display pixels, and the circuit structures on the non-stretching portion 102B may correspond to a plurality of display pixels.

Figure 5A:
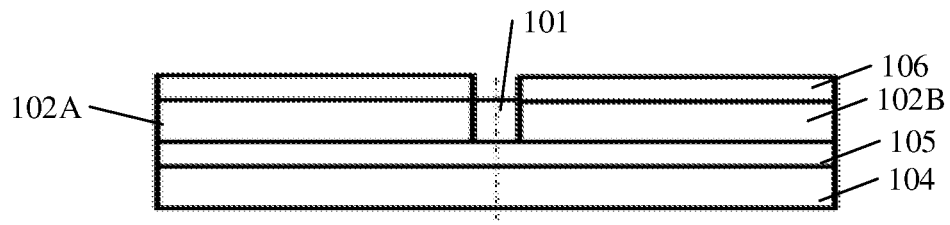
FIGS. 5A, 6A, 7A and 8-11 are sectional diagrams of an electronic device, in a manufacture process, provided by some embodiments of the present disclosure.
Figure 5B:
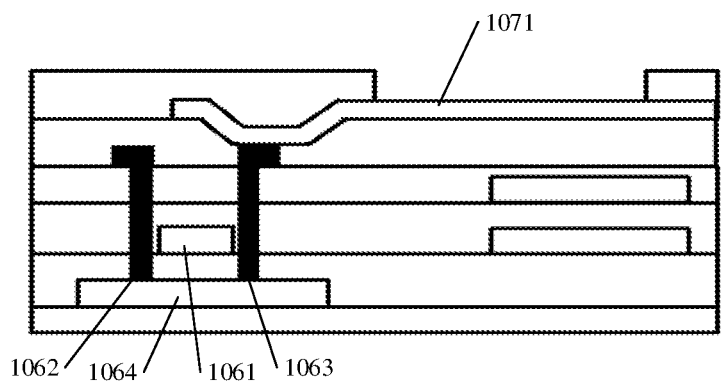
FIG. 5B is a sectional diagram of a thin film transistor included in an electronic device provided by some embodiments of the present disclosure.

For example, as illustrated in FIG. 5A, thin film transistor layers 106 are first formed on the first non-stretching portion 102A and the second non-stretching portion 102B by a method such as patterning. The patterning method comprises, for example, processes of photoresist coating, exposing, developing, etching, and so on. For example, the thin film transistor layer 106 comprises a plurality of thin film transistors. As illustrated in FIG. 5B, the formed thin film transistor may comprise, for example, structures of a gate electrode 1061, a source electrode 1062, a drain electrode 1063, an active layer 1064, and so on. The thin film transistor may be formed, for example, to be a top-gate-type thin film transistor or a-bottom gate-type thin film transistor. The active layer may be amorphous silicon, polycrystalline silicon, an oxide semiconductor (for example, IGZO, etc.), or the like, which is not specifically limited in the embodiments of the present disclosure. The thin film transistors may be used to drive the light emitting structures to be formed later.

Figure 6A:
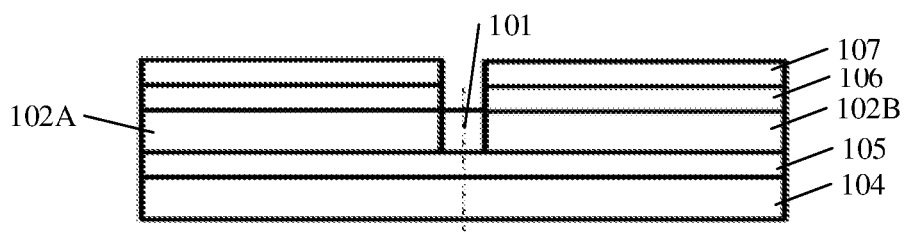
Figure 6B:
FIG. 6B is a sectional diagram of a light emitting structure included in an electronic device provided by some embodiments of the present disclosure.

For example, as illustrated in FIG. 6A, after the thin film transistor layers 106 are formed, light emitting structures 107 may be formed by a method such as patterning. The light emitting structure 107 comprises, for example, a plurality of pixel units, and each pixel unit is formed corresponding to a thin film transistor. As illustrated in FIG. 6B, each pixel unit of the light emitting structure 107 may comprise, for example, an organic light emitting diode, and the organic light emitting diode comprises a first electrode 1071, a second electrode 1072, and a light emitting layer 1074, a hole transport layer 1073, an electron transport layer 1075 which are between the first electrode 1071 and the second electrode 1072. The organic light emitting diode may emit red light, green light, blue light, or the like, which is not limited by the embodiments of the present disclosure. When a voltage is applied between the first electrode 1071 and the second electrode 1072, electrons and holes are injected into the light emitting layer, and the electrons and the holes are combined and excited, so that the light emitting layer 1074 can emit light. For example, the first electrode 1071 of each pixel unit can be connected to the source electrode 1062 or the drain electrode 1063 of a corresponding thin film transistor, thereby achieving the driving of the light emitting structures 107 by the thin film transistors. For example, the case where the first electrode 1071 is connected to the drain electrode 1063 of the thin film transistor in an example is illustrated in FIG. 5B.

Figure 7A:
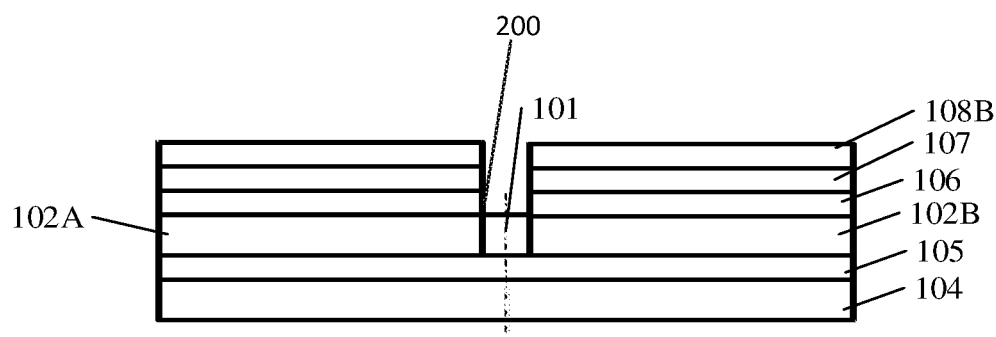
Figure 7B:
FIG. 7B is a sectional diagram of a second encapsulation layer included in an electronic device provided by some embodiments of the present disclosure.

For example, as illustrated in FIG. 7A, after the above circuit structures are formed, second encapsulation layers 108B may be formed on the light emitting structures 107. As illustrated in FIG. 7B, the second encapsulation layer 108B may comprise, for example, a first inorganic encapsulation layer 1081, a second organic encapsulation layer 1082, and a third inorganic encapsulation layer 1083. For example, the inorganic materials for forming the first inorganic encapsulation layer 1081 and the third inorganic encapsulation layer 1083 may comprise silicon nitride, silicon oxide, silicon oxynitride, titanium oxide, zirconium oxide, tantalum oxide, barium titanate, neodymium oxide, aluminum oxynitride, zirconium oxynitride, tantalum oxynitride, yttrium oxynitride, neodymium oxynitride or other suitable materials. The above-mentioned inorganic encapsulation materials have excellent water blocking property, and can effectively prevent moisture introduced during the formation of each functional layer and moisture in the air from infiltrating into the circuit structures. The organic material for forming the second organic encapsulation layer 1082 may comprise, for example, polyimide (PI), epoxy resin or other suitable materials. The three-layer encapsulation structure can provide effective encapsulation and protection for the circuit structures.

Figure 7C:
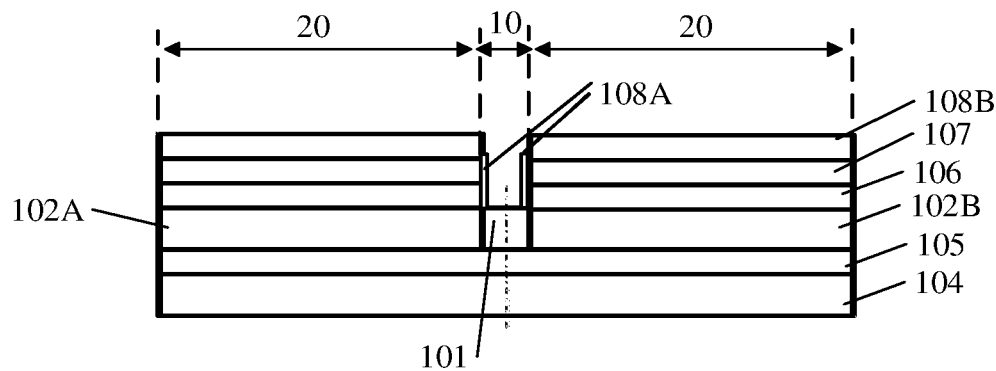
FIG. 7C is a sectional diagram of an electronic device, formed with first encapsulation layers, provided by some embodiments of the present disclosure.

For example, in another example of the embodiments of the present disclosure, as illustrated in FIG. 7C, after the above circuit structures are formed, first encapsulation layers 108A may be formed on side edges of the circuit structures in the stretching region 10 of the electronic device. For example, the first encapsulation layers 108A are in direct contact with side edges 200 (referring to FIG. 7A) of the circuit structures, as illustrated in FIG. 7A, side edges 200 of adjacent circuit structures are opposite to each other. For example, side edges 200 of the circuit structures may intersect with (for example, be perpendicular to) the flexible substrate 104. The first encapsulation layers 108A may provide encapsulation and protection for the side edges of the circuit structures in the non-stretching regions 20. The first encapsulation layers 108A may be formed, for example, to be very thin layers (for example, the first encapsulation layers 108A may be single-layer encapsulation layers, for example, the first encapsulation layers 108A may be single-layer encapsulation layers formed of inorganic materials), so that after the stretching portion is restored, there is no significant gap between the first non-stretching portion 102A and the second non-stretching portion 102B (for example, the user cannot notice the gap between the first non-stretching portion 102A and the second non-stretching portion 102B).

Figure 8:
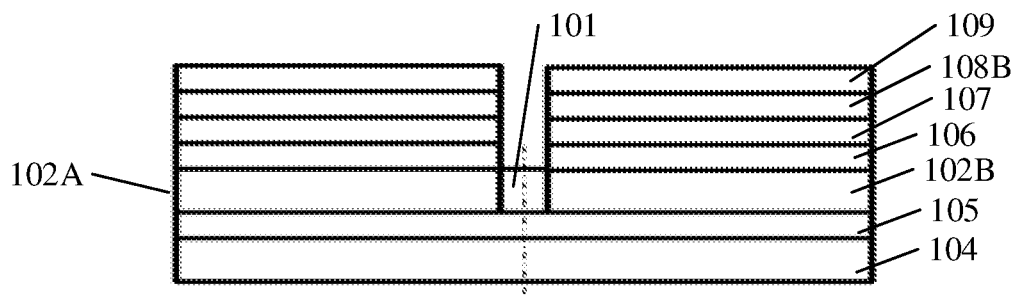

For example, as illustrated in FIG. 8, after the second encapsulation layers 108B are formed, touch layers 109 may be formed on the second encapsulation layers 108B. The touch layer 109 may comprise, for example, a single-layer touch pattern, a double-layer touch pattern, a cross-bridge type touch pattern, or other touch pattern of any type, which is not limited in the embodiments of the present disclosure.

In another example of the embodiments of the present disclosure, the touch layers 109 may be formed separately, for example, and then attached to the second encapsulation layers 108B. Alternatively, the touch layers 109 may also be formed at the inner side of the second encapsulation layers 108B, so that the second encapsulation layers 108B can also provide encapsulation and protection for the touch layers 109. The forming method of the touch layers 109 is not specifically limited in the embodiments of the present disclosure. Moreover, the touch layers 109 may be touch structures of any suitable type, such as a resistive type, a capacitive type, or the like, and the capacitive type can further comprise a self-capacitance type or a mutual capacitance type.

Step S104: releasing the fixing of the stretching portion to allow the stretching portion to be restored.

For example, after the above structures are formed, the flexible substrate may be separated from the rigid substrate by laser irradiation (corresponding to the rigid substrate formed of a material such as glass or transparent ceramic) or a mechanical method (for example, heating, corresponding to the rigid substrate formed of a material such as non-transparent ceramic or stainless steel), so as to release the fixing of the stretching portion.

Figure 9:
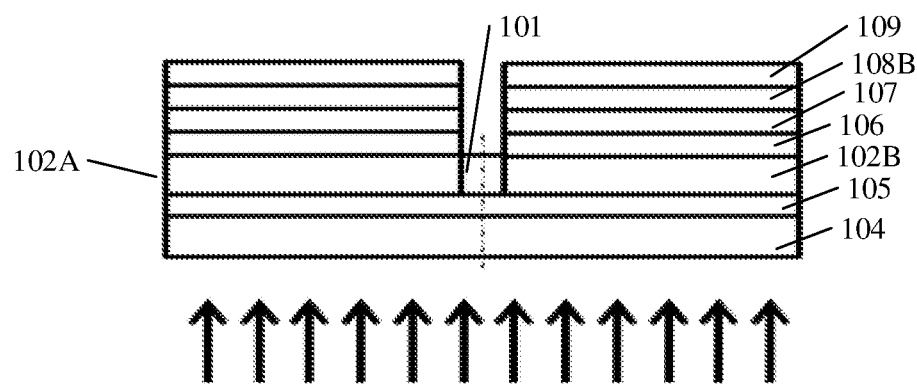
Figure 10:
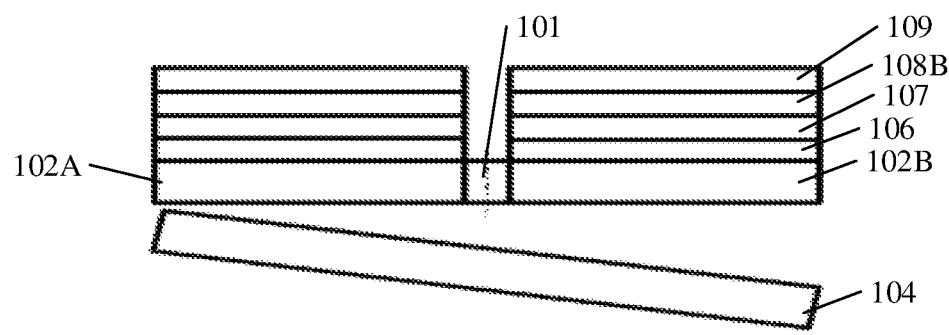

For example, as illustrated in FIG. 9 and FIG. 10, the laser may be irradiated on the surface of the flexible substrate 104 to weaken the adhesion of the sacrificial layer 105, thereby separating the flexible substrate from the rigid substrate 104, and releasing the fixing of the stretching portion 101, and in this case, because the adhesion of the sacrificial layer 105 is weakened, the sacrificial layer 105 is stripped off easily from the surfaces of the flexible substrate and the rigid substrate 104.

For example, after the fixing of the stretching portion is released, there is no stretching force applied to the stretching portion, and in this case, the elasticity restoring force of the stretching portion allows the size of the stretching portion 101 in the direction in which the first non-stretching portion 102A and the second non-stretching portion 102B are arranged in parallel to be reduced, thereby reducing the distance between the first non-stretching portion 102A and the second non-stretching portion 102B on both sides of the stretching portion and reducing the distance between the circuit structures on both sides of the stretching portion. Therefore, the size of the dead region of the electronic device is reduced, and the performance of the electronic device is improved.

Figure 11:
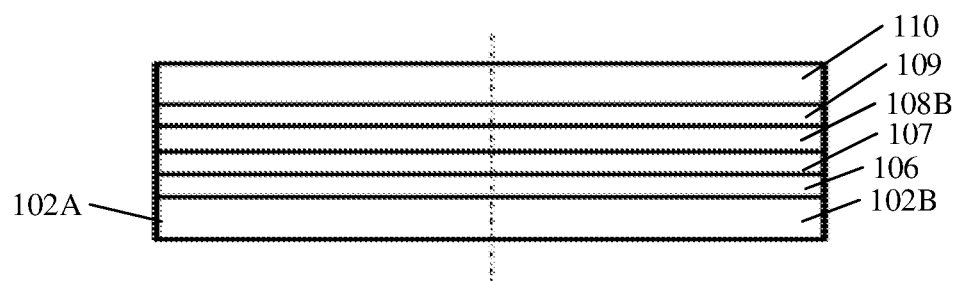

For example, in an example of the embodiments of the present disclosure, as illustrated in FIG. 11, after the stretching portion 101 is restored, the circuit structures of the non-stretching portions, that is, the first non-stretching portion 102A and the second non-stretching portion 102B, on both sides of the stretching portion 101 may be in contact with each other (and, for example, insulated from each other) or there is only a small distance between the circuit structures of the non-stretching portions, and the small distance may be, for example, less than or equal to the distance between adjacent pixel units in the light emitting structures 107 in the circuit structures, and therefore the distance does not adversely affect the overall display effect of the light emitting structures 107 of the electronic device on both sides of the stretching portion.

For example, referring to FIG. 11, after the stretching portion 101 is restored, the manufacture method provided by embodiments of the present disclosure may further comprise, for example: adhering a flexible cover plate 110 to the flexible substrate formed with the circuit structures, so as to allow the circuit structures to be covered. For example, the flexible cover plate may be formed on the side, that is away from the flexible substrate, of the circuit structures. The flexible cover plate 110 is transparent and flexible, and can be folded along with the stretching portion 101 of the flexible substrate being folded, and the transparency of the flexible cover plate 110 does not adversely affect the display effect of the light emitting structures 107 formed on the flexible substrate. For example, the flexible cover plate 110 has a flexibility that allows a first region of the flexible cover plate 110 that is stacked with the first non-stretching portion 102A to be stacked with a second region of the flexible cover plate 110 that is stacked with the second non-stretching portion 102B.

For example, in an example of the embodiments of the present disclosure, in a process of forming the circuit structures on the first non-stretching portion 102A and the second non-stretching portion 102B, for example, driving circuits may also be formed respectively on the first non-stretching portion 102A and the second non-stretching portion 102B to respectively control the circuit structures on the first non-stretching portion 102A and the second non-stretching portion 102B. In this case, the circuit structure on the first non-stretching portion 102A and the circuit structure on the second non-stretching portion 102B are independent with each other and can be independently controlled.

Figure 12A:
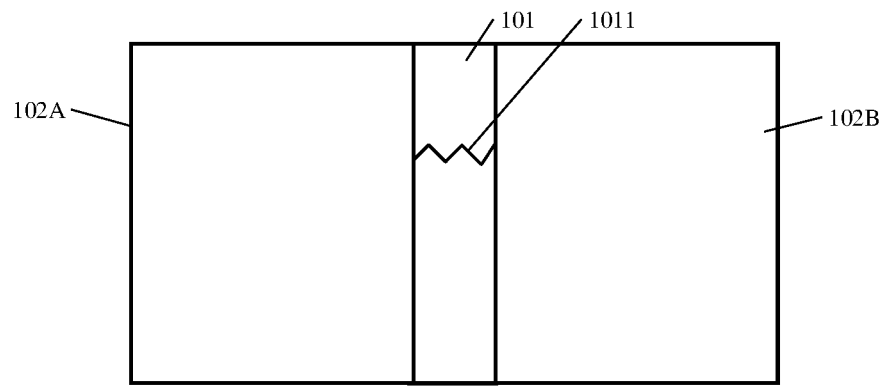
FIGS. 12A-12C are three plane diagrams illustrating circuit structures in non-bending regions being connected by a wire, provided by some embodiments of the present disclosure.
Figure 12B:
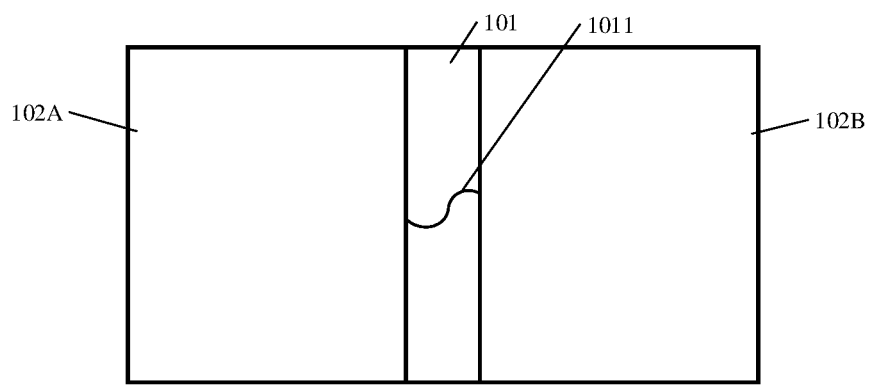
Figure 12C:
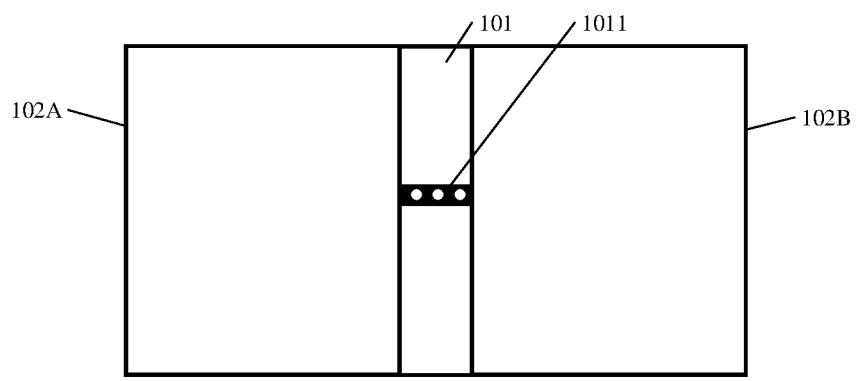

For example, in another example of the embodiments of the present disclosure, as illustrated in FIGS. 12A, 12B, and 12C, in a process of forming the circuit structures on the first non-stretching portion 102A and the second non-stretching portion 102B, a wire 1011 may also be formed on the stretching portion 101 of the flexible substrate to connect the circuit structure on the first non-stretching portion 102A and the circuit structure on the second non-stretching portion 102B, so that both of the circuit structure on the first non-stretching portion 102A and the circuit structure on the second non-stretching portion 102B can be controlled in the case where the driving circuit is only formed on one of the first non-stretching portion 102A and the second non-stretched portion 102B. In this case, the circuit structure on the first non-stretching portion 102A and the circuit structure on the second non-stretching portion 102B are electrically connected and can both be controlled by a same driving signal.

For example, in this example, the wire 1011 formed on the stretching portion 101 of the flexible substrate, for example, may be in a zigzag line shape (the case as illustrated in FIG. 12A), be in an S shape (the case as illustrated in FIG. 12B), or have subjected to a hollowing process (the case as illustrated in FIG. 12C, in which the colorless circle is a hollowed-out structure), so that the zigzag line shape, the S shape, or the hollow-out shape of the wire 1011 change adaptively along with the reduction of the size of the stretching portion 101 during the restoration of the stretching portion 101, and the effect of the electrical connection between the circuit structure on the first non-stretching portion 102A and the circuit structure on the second non-stretching portion 102B is not adversely affected.

In some examples of the present disclosure, after the stretching portion 101 is restored, the circuit structures on the first non-stretching portion 102A and the second non-stretching portion 102B can be conjoined together, and there is a small distance (that is, a size of the seam is small) between the circuit structure on the first non-stretching portion 102A and the circuit structure on the second non-stretching portion 102B, this distance may be, for example, less than or equal to the distance between adjacent pixel units in the light emitting structures 107 in the circuit structures. Therefore, in the case where the plurality of circuit structures are used for display, no gap can be observed by the user at the position between the circuit structure for display on the first non-stretching portion 102A and the circuit structure for display on the second non-stretching portion 102B. In this case, the electronic device, for example, does not have a dead region, and therefore a seamless display can be realized, and the electronic device has a better display effect. In addition, because the electronic device is bent only in the stretching region (that is, the region that is corresponding to the stretching portion 101 of the flexible substrate), the requirements on the flexibility of materials of functional components such as the circuit structures that are formed in the non-stretching regions (that is, the structures that are formed on the first non-stretching portion 102A and the second non-stretching portion 102B) of the electronic device is reduced (for example, non-flexible materials can be used), thereby broadening the selection range of the materials and reducing the design difficulty and simplifying the manufacture process of the functional components such as the circuit structures, and improving the performance of the electronic device.

Figure 13:
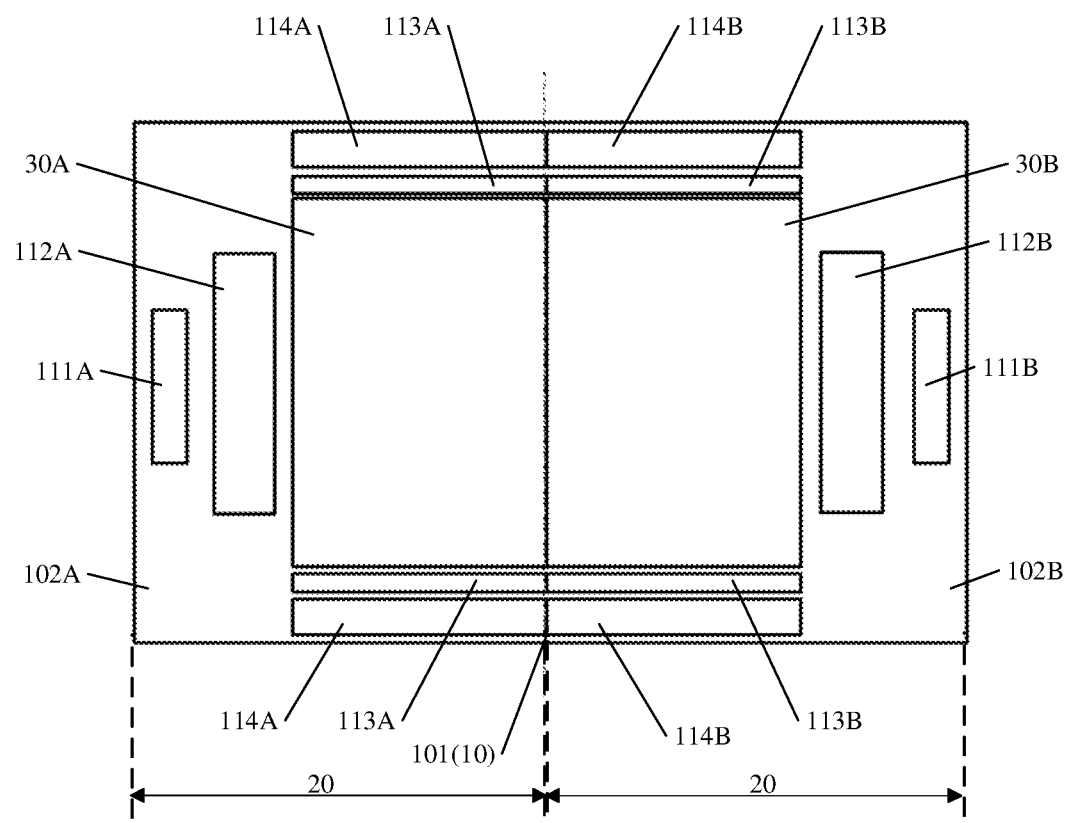
FIG. 13 is a plane diagram of an electronic device provided by some embodiments of the present disclosure.

Another embodiment of the present disclosure provides an electronic device, as illustrated in FIG. 13, the electronic device comprises a stretching region 10 and a non-stretching region 20 on both sides of the stretching region 10 (because the stretching region shown in the figure is not in a stretching state, and therefore a width of the stretching region is small), and the electronic device comprises a flexible substrate and circuit structures. The flexible substrate comprises a stretching portion 101 and non-stretching portions (including, for example, a first non-stretching portion 102A and a second non-stretching portion 102B) on both sides of the stretching portion 101. The stretching portion 101 and the non-stretching portions are respectively in the stretching region 10 and the non-stretching regions 20. Circuit structures 30A and 30B are respectively disposed on the non-stretching portions 102A and 102B. The stretching portion 101 is stretched during the manufacture process of the electronic device, and the electronic device can be bent through the stretching region 10 (that is, the position corresponding to the stretching region of the flexible substrate). In a non-bending state of the electronic device, the stretching portion 101 is in a non-stretching state. For example, in the case where the electronic device in a display state, the electronic device is in the non-bending state, in the case where the electronic device is transported and stored, the electronic device is in a bending state to reduce the space occupied by the electronic device. For example, the electronic device may comprise a plurality of bending regions, a plurality of first non-stretching portions 102A, and a plurality of second non-stretching portions 102B, so as to further reduce the space occupied by the electronic device when the electronic device is transported and stored.

For example, the electronic device provided by embodiments of the present disclosure may further comprise a flexible cover plate, the flexible cover plate is disposed on the side of the circuit structures away from the flexible substrate to cover the circuit structures. The flexible cover plate can protect the circuit structures, and can also be bent in the case where the electronic device is folded.

For example, in embodiments of the present disclosure, each of the circuit structure 30A on the non-stretching portions 102A and the circuit structure 30B on the non-stretching portions 102A and 102B comprise a light emitting circuit layer (that is, a light emitting structure layer) and a touch layer that are sequentially disposed on the flexible substrate. The light emitting circuit layer can be used for realizing display function, and the touch layer can be used for performing touch operation with respect to circuit structures such as the light emitting circuit layer.

For example, in embodiments of the present disclosure, the circuit structures 30A and 30B further comprise second encapsulation layers between the light emitting circuit layers and the touch layers. The second encapsulation layer may comprise, for example, a first inorganic encapsulation layer, a second organic encapsulation layer, and a third inorganic encapsulation layer. Materials of the second encapsulation layer and the positional relationship between the second encapsulation layer and the touch layer can be referred to the previous embodiment(s), and no further description will be given in embodiments of the present disclosure. The three-layer encapsulation structure can realize an effective encapsulation and protection for the circuit structures.

For example, in embodiments of the present disclosure, the electronic device may further comprise at least two groups of driving circuits, the at least two groups of driving circuits are respectively disposed in the non-stretching regions on both sides of the stretching region of the electronic device (for example, disposed on the non-stretching portions on both sides of the stretching portion of the flexible substrate), so as to respectively provide driving signals for the circuit structures on both sides of the stretching region. In this case, the circuit structures on both sides of the stretching region can be independently controlled. For example, the circuit structure on the left side of the stretching region is driven by a group of driving circuits on the left side of the stretching region to display partially sub-image of an image output by the electronic device, and the circuit structure on the right side of the stretching region is driven by another group of driving circuits on the right side of the stretching region to display partially sub-image of the image output by the electronic device.

For example, as illustrated in FIG. 13, the electronic device comprises two groups of driving circuits respectively disposed in the non-stretching regions of the electronic device, that is, a first non-stretching portion 102A and a second non-stretching portion 102B on both sides of the stretching portion of the flexible substrate, so as to respectively provide driving signals to the circuit structures 30A and 30B on the first non-stretching portion 102A and the second non-stretching portion 102B. For example, a first group of driving circuits comprises a first data driving IC 111A, a first wiring region 112A for electrically connecting the circuit structure 30A on the first non-stretching portion 102A and the first data driving IC 111A, a first signal line (for example, a VSS signal line) 113A, a first gate driver 114A, and so on. A second group of driving circuits comprises a second data driving IC 111B, a second wiring region 112B for electrically connecting the circuit structures 30B on the second non-stretching portion 102B and the second data driving IC 111B, a second signal line (for example, a VSS signal line) 113B, a second gate driver 114B, and so on. Therefore, the circuit structure 30A on the first non-stretching portion 102A can be independently controlled by the first group of driving circuits, and the circuit structure 30B on the second non-stretching portion 102B can be independently controlled by the second group of driving circuits. For example, in an example, the first group of driving circuits and the second group of driving circuits can be synchronized by a clock signal or the like from a single timing controller (T-con). For example, the VSS signal line is used to transmit a power supply voltage (VSS voltage, generally a low voltage). In addition, the electronic device may further comprise a VDD signal line for transmitting another power supply voltage (VDD voltage, generally a high voltage).

For example, in another example of the embodiments of the present disclosure (referring to FIGS. 12A, 12B, and 12C), a wire 1011 may further be formed in the stretching region, that is, on the stretching portion 101 of the flexible substrate, to connect the circuit structure on the first non-stretching portion 102A and the circuit structure on the second non-stretching portion 102B, so that both of the circuit structure on the first non-stretching portion 102A and the circuit structure on the second non-stretching portion 102B can be controlled in the case where the driving circuit is only formed on one of the first non-stretching portion 102A and the second non-stretched portion 102B. In this case, the circuit structures on the first non-stretching portion 102A and the second non-stretching portion 102B are electrically connected and can both be controlled by a same driving signal.

In this example, the wire 1011 disposed on the stretching portion 101 of the flexible substrate, for example, may be in a zigzag line shape (the case as illustrated in FIG. 12A), be in an S shape (the case as illustrated in FIG. 12B), or have subjected to a hollowing process (the case as illustrated in FIG. 12C, in which the colorless circle is a hollowed-out structure), so that the zigzag line shape, the S shape, or the hollow-out shape of the wire 1011 change adaptively along with the reduction of the size of the stretching portion 101 during the restoration of the stretching portion 101, and the effect of the electrical connection between the circuit structure on the first non-stretching portion 102A and the circuit structure on the second non-stretching portion 102B is not adversely affected.

In embodiments of the present disclosure, for example, the electronic device further comprises first encapsulation layers 108A, referring to FIG. 7, the first encapsulation layers are disposed on the side edges of the circuit structures closer to the stretching portion. The first encapsulation layers 108A can provide encapsulation and protection for the side edges of the circuit structures.

In some example of the present disclosure, the circuit structures on the first non-stretching portion 102A and the second non-stretching portion 102B can be conjoined together, or there is a small distance between the circuit structure on the first non-stretching portion 102A and the circuit structure on the second non-stretching portion 102B, this distance may be, for example, less than or equal to the distance between adjacent pixel units in the light emitting structures 107 in the circuit structures, so that, in the case where the plurality of circuit structures are used for display, the circuit structures for display on the first non-stretching portion 102A and the second non-stretching portion 102B can achieve a seamless display, and no dead region presents, and therefore a better display effect can be realized. In addition, because the electronic device is bent only in the stretching region, which corresponds to the stretching portion 101 of the flexible substrate, the requirements on the flexibility of materials of functional components such as the circuit structures that are formed in the non-stretching region (that is, the first non-stretching portion 102A and the second non-stretching portion 102B) of the electronic device is reduced, thereby broadening the selection range of the materials and reducing the design difficulty and simplifying the manufacture process of the functional components such as the circuit structures, and improving the performance of the electronic device.

In the embodiments of the present disclosure, the electronic device may be, for example, an electronic product or a component, such as a mobile phone, a tablet computer, a television, a display, a notebook computer, a digital photo frame, a navigator, or the like, which is not limited by the embodiments of the present disclosure.

Figure 14A:
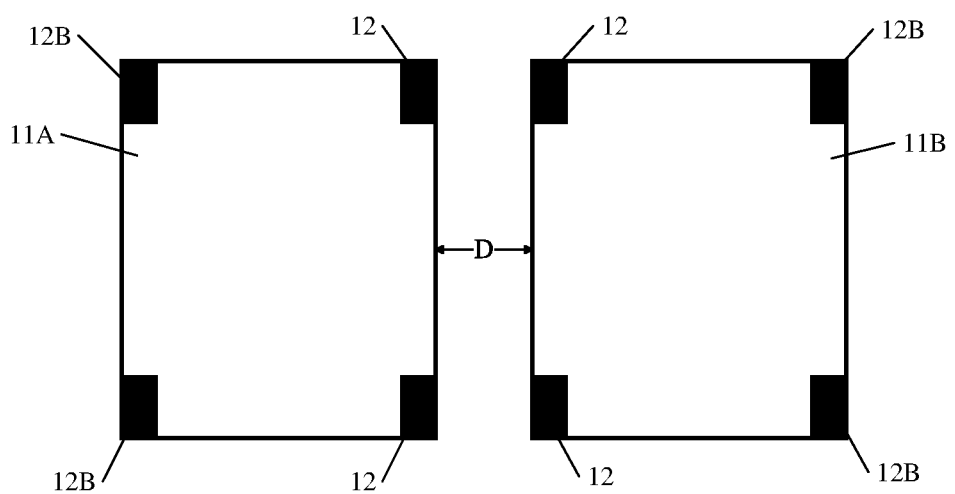
FIGS. 14A and 14B are two plane diagrams of a manufacture tool for an electronic device provided by some embodiments of the present disclosure.

Further another embodiment of the present disclosure provides a manufacture tool for an electronic device, as illustrated in FIG. 14A, the manufacture tool comprises a bearing platform (11A/11B) and at least one fixing portion 12. The bearing platform (11A/11B) is used for supporting a flexible substrate, and the fixing portion is used for detachably fixing the flexible substrate to the bearing platform. The bearing platform (11A/11B) comprises at least two portions (that is, a first portion 11A and a second portion 11B) that are arranged in parallel, the size of the gap D between adjacent two portions, that is, the first portion 11A and the second portion 11B, is adjustable, and the at least one fixing portion (for example, two or four) is respectively disposed at an edge position of the first portion 11A closer to the gap D and an edge position of the second portion 11B closer to the gap D, so as to allow the fixed flexible substrate to be stretched only at a position corresponding to the gap D.

For example, in the case where the flexible substrate comprises a stretching portion and non-stretching portions on both sides of the stretching portion, as illustrated in FIG. 14A, the fixing portions 12 may be disposed, for example, at a corner position of the first portion 11A closer to the gap D and a corner position of the second portion 11B closer to the gap D, so that the non-stretching portions can be fixed along boundaries between the stretching portion and the non-stretching portions, and the stretching portion is placed at a position corresponding to the gap D. In the case where stretching forces are respectively applied to the bearing platform along a horizontal direction, the stretching portion can be stretched. In embodiments of the present disclosure, the manufacture tool may further comprise, for example, an auxiliary fixing portion 12B, which is used for fixing edges of the other sides of the non-stretching portions. The fixing portions 12 and the auxiliary fixing portions 12B are, for example, jigs of suitable types, including jigs of stretching performance, threaded jigs, or the like.

Figure 14B:
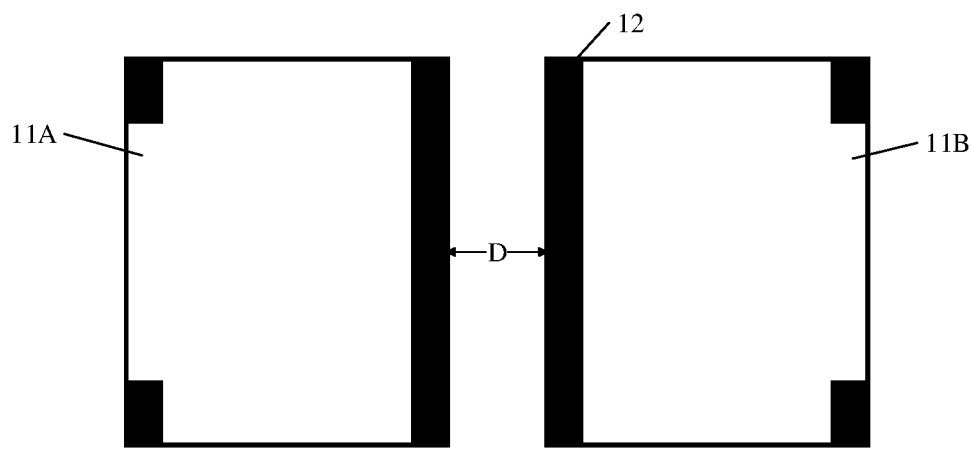

For example, as illustrated in FIG. 14B, the fixing portion 12 may be disposed, for example, along the entire edge position of the first portion 11A closer to the gap D and the entire edge position of the second portion 11B closer to the gap D, so that the non-stretching portions can be fixed along entire boundaries between the stretching portion and the non-stretching portions. In the case where stretching forces are respectively applied to the bearing platform in a horizontal direction, this arrangement facilitates to stretch the stretching portion of the flexible substrate only at the position corresponding to the gap D, and the non-stretching portions of the flexible substrate is not affected (that is, is not stretched).

Figure 15:
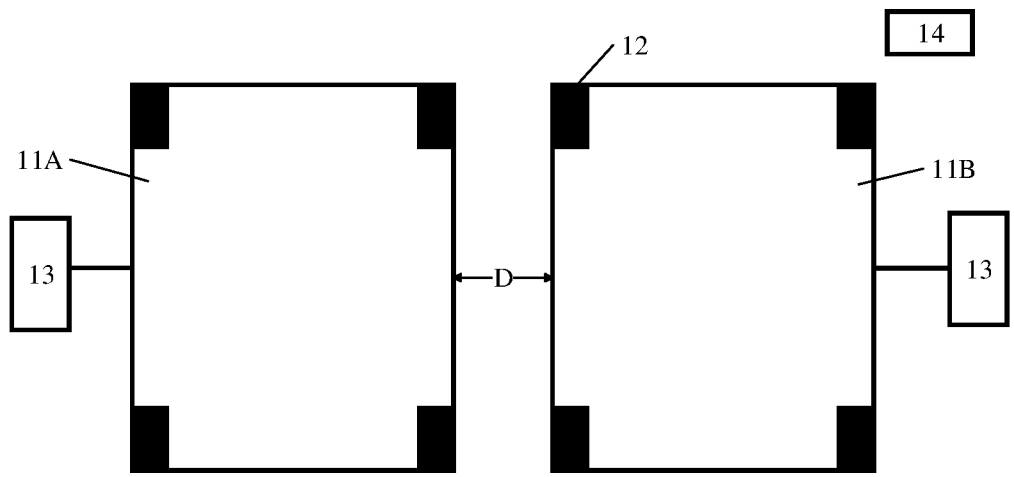
FIG. 15 is another plane diagram of a manufacture tool for an electronic device provided by some embodiments of the present disclosure.

For example, as illustrated in FIG. 15, the manufacture tool for an electronic device provided by embodiments of the present disclosure may further comprise a driving device 13, and the driving device 13 is drive connected to the bearing platform (for example, the driving device 13 is connected to the bearing platform and can drive the bearing platform to move) to adjust the size of the gap D between adjacent two portions, that is, the first portion 11A and the second portion 11B as illustrated in the figure, of the bearing platform, so as to stretch or restore the stretching portion, that is corresponding to the gap D, of the fixed flexible substrate.

For example, the driving device 13 may comprise a power source and a motion and power transmission structure. The power source, for example, comprises a motor (such as a stepping motor or the like), an air cylinder, a hydro-cylinder, and so on, and the motion and power transmission component may comprise a screw, a belt, a gear, a turbine, and so on. The driving device 13 is drive connected to the first portion 11A and/or the second portion 11B of the bearing platform and can be operated according to predetermined instructions, so as to push the first portion 11A and/or the second portion 11B, and adjust the size of the gap D between the first portion 11A and the second portion 11B. The manufacture tool provided by embodiments of the present disclosure may further comprise a control device 14, which is connected (for example, wired or wireless connected) to the driving device 13 through a signal, so as to transmit the predetermined instructions to the driving device 13. In addition, the control device 14 is also connected to an input device (such as a keyboard, a touchpad, a mouse, or the like), an output device (such as a display), and so on, so as to facilitate an operator to perform operations such as setting, monitoring, and so on. The control device 14 may be any electronic device having a control function, such as a central processing unit (CPU), a programmable logic controller (PLC), a single chip computer, or the like.

For example, the driving device 13 may adjust the gap D between the first portion 11A and the second portion 11B to be a first predetermined length first, so that the stretching portion of the flexible substrate is stretched to have a first predetermined length, and then after functional components such as circuit structures on the flexible substrate are manufactured by semiconductor manufacture processes including a thin film deposition process, a patterning process, and so on, the driving device 13 may adjust the gap D between the first portion 11A and the second portion 11B to be a second predetermined length, and the second predetermined length may be, for example, zero or close to zero, so that the stretching portion is restored, and then the flexible substrate may be subjected to subsequent manufacture processes.

For another example, the driving device 13 may adjust the gap D between the first portion 11A and the second portion 11B to a first predetermined length first, so that the stretching portion of the flexible substrate is stretched to have a first predetermined length. Then, the flexible substrate is fixed to a rigid substrate 104, and the rigid substrate 104 is used to allow the stretching portion to be maintained in a stretching state. Next, the auxiliary fixing portions 12B are removed, and functional components such as circuit structures are manufactured on the flexible substrate by semiconductor manufacture processes including a thin film deposition process, a patterning process, and so on. Finally, the rigid substrate 104 is removed, the stretching portion is restored, and the flexible substrate is subjected to subsequent manufacture processes.

The manufacture tool for the electronic device can be used to manufacture an electronic device, and the manufactured electronic device has better performance (for example, display effect). For example, compared to conventional conjoined electronic devices, the electronic device provided by some examples of the present disclosure has a smaller dead region, thereby improving device performance (for example, display effect). For another example, compared to a fully flexible electronic device, the electronic device provided by some examples of the present disclosure can adopt flexible materials only in a bending region, and can adopt non-flexible materials or materials with relatively small flexibility to manufacture circuit structures in the non-bending region, thereby broadening the selection range of the materials and reducing the design difficulty and simplifying the manufacture process of the functional components such as the circuit structures, and improving the performance of the electronic device.

The following several statements should be noted.

(1) The accompanying drawings involve only the structure(s) in connection with the embodiment(s) of the present disclosure, and other structure(s) can be referred to common design(s).

(2) For clarity, in accompanying drawings for illustrating the embodiment(s) of the present disclosure, the thickness of a layer or a structure can be enlarged or reduced. However, it should understood that, in the case in which a component or element such as a layer, film, area, substrate or the like is referred to be "on" or "under" another component or element, it can be directly on or under the another component or element or a component or element is interposed therebetween.

(3) In case of no conflict, embodiments of the present disclosure and the features in the embodiments can be mutually combined to obtain new embodiments.

The above descriptions are only specific embodiments of the present disclosure, but the protection scope of the present disclosure is not limited thereto, those skilled in the art can make some improvements and modifications within the technical scope of the present disclosure, and the improvements and modifications should be within the protection scope of the present disclosure. Therefore, the protection scope of the present disclosure should be determined by the protection scope of the claims.

What is claimed is:

1. A manufacture method of an electronic device comprising a stretching region and non-stretching regions on both sides of the stretching region, comprising:
   providing a flexible substrate, the flexible substrate comprising a stretching portion and non-stretching portions on both sides of the stretching portion, wherein the stretching portion and the non-stretching portions respectively correspond to the stretching region and the non-stretching regions;
   stretching the stretching portion in a direction perpendicular to a longitudinal direction of the stretching portion, and then fixing the stretching portion and allowing the stretching portion to be maintained in a stretching state;
   forming circuit structures on the non-stretching portions; and
   releasing the fixing of the stretching portion to allow the stretching portion to be restored.

2. The manufacture method of the electronic device according to claim 1, wherein stretching of the stretching portion comprises: fixing the non-stretching portions along boundaries between the stretching portion and the non-stretching portions, and stretching the stretching portion via positions where the boundaries are located.

3. The manufacture method of the electronic device according to claim 1, wherein after the stretching portion is stretched, the flexible substrate is fixed to a rigid substrate, so as to allow the stretching portion to be maintained in the stretching state.

4. The manufacture method of the electronic device according to claim 3, wherein after the circuit structures are formed, the flexible substrate is separated from the rigid substrate, so as to release the fixing of the stretching portion.

5. The manufacture method of the electronic device according to claim 4, wherein a sacrificial layer is formed on the rigid substrate to fix the flexible substrate to the rigid substrate by adhering, and the sacrificial layer is removed when separating the flexible substrate from the rigid substrate.

6. The manufacture method of the electronic device according to claim 1, wherein the circuit structures on the non-stretching portions on both sides of the stretching portion are simultaneously formed.

7. The manufacture method of the electronic device according to claim 6, wherein in a process of simultaneously forming the circuit structures, the flexible substrate is covered by a mask comprising a shielding portion; and the shielding portion corresponds to the stretching portion to block the stretching portion.

8. The manufacture method of the electronic device according to claim 6, wherein a structural layer comprising the circuit structures are formed on the flexible substrate, and then a portion of the structural layer in the stretching region is removed, so as to allow the stretching portion to be exposed.

9. The manufacture method of the electronic device according to claim 6, further comprising: forming a wire on the stretching portion to connect the circuit structures on both sides of the stretching portion.

10. The manufacture method of the electronic device according to claim 6, wherein after the circuit structures are formed, the method further comprises:
   in the stretching region, forming first encapsulation layers on side edges of the circuit structures.

11. The manufacture method of the electronic device according to claim 1, wherein after the stretching portion is restored, the method further comprises:
  forming a flexible cover plate on a side of the circuit structures away from the flexible substrate, so as to cover the circuit structures.

12. The manufacture method of the electronic device according to claim 1, wherein before the stretching portion is stretched, the method further comprises:
  performing a modification treatment on the stretching portion, so as to allow a tensile property of the stretching portion to be better than a tensile property of the non-stretching portions.

13. An electronic device comprising a stretching region and non-stretching regions on both sides of the stretching region, comprising:
  a flexible substrate comprising a stretching portion and non-stretching portions on both sides of the stretching portion, wherein the stretching portion and the non-stretching portions respectively correspond to the stretching region and the non-stretching regions; and
  circuit structures on the non-stretching portions,
  wherein the stretching portion is stretched in a manufacture process of the electronic device, and the electronic device is bendable through the stretching region; and
  a flexible cover plate on a side of the circuit structures away from the flexible substrate to cover the circuit structures.

14. The electronic device according to claim 13, further comprising:
  at least two groups of driving circuits respectively in the non-stretching regions on both sides of the stretching region, so as to respectively provide driving signals for the circuit structures in the non-stretching regions.

15. The electronic device according to claim 13, further comprising:
  a wire in the stretching region, wherein the wire is configured to connect the circuit structures on both sides of the stretching portion.

16. The electronic device according to claim 13, further comprising:
  first encapsulation layers on side edges of the circuit structures closer to the stretching portion.

17. A manufacture tool for an electronic device, comprising:
  a bearing platform for supporting a flexible substrate; and
  two or more fixing portions for detachably fixing the flexible substrate to the bearing platform,
  wherein the bearing platform comprises at least two portions, a gap between adjacent two portions is adjustable, and the two or more fixing portions are respectively at edge positions of the two portions closer to the gap, so as to allow the flexible substrate that is fixed to be stretched only at a position corresponding to the gap.

18. The manufacture tool for the electronic device according to claim 17, further comprising a driving device,
  wherein the driving device is connected to and configured to drive the bearing platform, so as to adjust a size of the gap between the adjacent two portions of the bearing platform, so as to stretch or restore the flexible substrate that is fixed.

19. The manufacture method of the electronic device according to claim 1, wherein the circuit structures are formed on the non-stretching portions while the stretching portion is maintained in the stretching state.

* * * * *